United States Patent
Yamagishi et al.

(10) Patent No.: US 11,839,069 B2
(45) Date of Patent: Dec. 5, 2023

(54) ELECTROMAGNETIC WAVE ABSORBING SHEET AND METHOD OF MANUFACTURING THE SAME

(71) Applicant: ZEON CORPORATION, Tokyo (JP)

(72) Inventors: Tomoko Yamagishi, Tokyo (JP); Mitsugu Uejima, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 492 days.

(21) Appl. No.: 17/276,527

(22) PCT Filed: Sep. 25, 2019

(86) PCT No.: PCT/JP2019/037682
§ 371 (c)(1),
(2) Date: Mar. 16, 2021

(87) PCT Pub. No.: WO2020/067203
PCT Pub. Date: Apr. 2, 2020

(65) Prior Publication Data
US 2022/0039299 A1 Feb. 3, 2022

(30) Foreign Application Priority Data

Sep. 28, 2018 (JP) ................................. 2018-185065

(51) Int. Cl.
*H05K 9/00* (2006.01)
*C01B 32/159* (2017.01)
(Continued)

(52) U.S. Cl.
CPC ........... *H05K 9/009* (2013.01); *C01B 32/159* (2017.08); *C01B 32/174* (2017.08); *B82Y 30/00* (2013.01); *B82Y 40/00* (2013.01); *C01B 2202/02* (2013.01)

(58) Field of Classification Search
CPC ..................................................... H05K 9/009
See application file for complete search history.

(56) References Cited

U.S. PATENT DOCUMENTS

2008/0318049 A1  12/2008  Hata et al.
2010/0149018 A1*  6/2010  Umishita ............. H01Q 17/002
                                                          342/1
(Continued)

FOREIGN PATENT DOCUMENTS

JP      2012174833 A    9/2012
JP      2012174834 A    9/2012
(Continued)

OTHER PUBLICATIONS

Mar. 23, 2021, International Preliminary Report on Patentability issued in the International Patent Application No. PCT/JP2019/037682.

*Primary Examiner* — Hung V Ngo
(74) *Attorney, Agent, or Firm* — KENJA IP LAW PC (57) ABSTRACT

Disclosed is an electromagnetic wave absorbing sheet which includes a sheet-shaped fibrous substrate and carbon nanotubes positioned in a space inside in a thickness direction of the sheet-shaped fibrous substrate, wherein the fibrous substrate is composed of organic fibers, the carbon nanotubes comprise single-walled carbon nanotubes as a main component, and the electromagnetic wave absorbing sheet has an electrical conductivity of 0.7 S/cm or more and 20 S/cm or less.

6 Claims, 2 Drawing Sheets

(51) Int. Cl.
*C01B 32/174* (2017.01)
*B82Y 30/00* (2011.01)
*B82Y 40/00* (2011.01)

(56) References Cited

U.S. PATENT DOCUMENTS

| | | | | |
|---|---|---|---|---|
| 2013/0202865 | A1* | 8/2013 | Choi | B82Y 30/00 |
| | | | | 428/206 |
| 2014/0151111 | A1* | 6/2014 | Shah | H05K 9/009 |
| | | | | 427/457 |
| 2015/0368108 | A1 | 12/2015 | Sone | |
| 2019/0387648 | A1* | 12/2019 | Nagamune | B32B 27/12 |
| 2020/0102697 | A1* | 4/2020 | Yamagishi | B82Y 30/00 |
| 2022/0071068 | A1* | 3/2022 | Katada | D06M 11/74 |
| 2023/0276606 | A1* | 8/2023 | Abe | H05K 9/009 |
| | | | | 174/391 |

FOREIGN PATENT DOCUMENTS

| | | |
|---|---|---|
| WO | 2006011655 A1 | 2/2006 |
| WO | 2010113303 A1 | 10/2010 |
| WO | 2014115560 A1 | 7/2014 |
| WO | 2015093600 A1 | 6/2015 |

* cited by examiner

| | Main surface (front) | | Main surface (back) | |
|---|---|---|---|---|
| | Sa [μm] | 3D surface profile | Sa [μm] | 3D surface profile |
| Example 1-1 | 23 |  | 24 |  |
| Example 1-2 | 30 |  | 31 |  |
| Comparative Example 1-1 | 5 |  | 7 |  |
| Comparative Example 1-2 | 7 |  | 8 |  |

ELECTROMAGNETIC WAVE ABSORBING SHEET AND METHOD OF MANUFACTURING THE SAME

TECHNICAL FIELD

The present disclosure relates to electromagnetic wave absorbing sheets and methods of manufacturing the same. In particular, the present disclosure relates to electromagnetic wave absorbing sheets comprising carbon nanotubes and methods of manufacturing the same.

BACKGROUND

Recently, carbon nanotubes (hereinafter also simply "CNTs") have attracted attention as a material that is lightweight and has good electrical conductivity, mechanical properties and other properties. However, CNTs and other fibrous carbon nanostructures have fine structures with diameters on the order of nanometers and as such are not necessarily easy to handle or process when used alone.

To address this problem, there have been proposed, for example, sheets formed of a substrate provided with CNTs and sheets made of compositions containing CNTs and other fibers. Such sheets have been applied to various applications.

Electromagnetic wave absorption has particularly attracted attention as one of such applications. For example, PTL 1 teaches that a sheet obtained by applying onto a substrate a coating liquid containing multi-walled carbon nanotubes and a resin component has an electromagnetic wave absorbing ability. PTL 2 teaches that a sheet obtained from a slurry containing cellulose fibers, carbon nanotubes dispersed with a dispersant and other components using the wet forming process can exert an electromagnetic wave absorbing ability.

CITATION LIST

Patent Literature

PTL 1: JP2012174833A 1
PTL 2: JP2012174834A

SUMMARY

Technical Problem

However, the conventionally proposed sheets such as those described above still have had room for improvement in favorably absorbing electromagnetic waves over a wide frequency band e.g., from 1.0 GHz to 10 GHz.

Solution to Problem

An object of the present disclosure is therefore to provide an electromagnetic wave absorbing sheet which can exert a good electromagnetic wave absorbing ability over a wide frequency band.

Another object of the present disclosure is to provide a method of manufacturing the electromagnetic wave absorbing sheet.

The inventor has conducted diligent investigation with the aim of solving the problem set forth above and established that an electromagnetic wave absorbing sheet in which carbon nanotubes comprising single-walled carbon nanotubes as a main component are positioned in a space inside in a thickness direction of a sheet-shaped fibrous substrate made of organic fibers and whose electrical conductivity falls within a predetermined range can favorably absorb electromagnetic waves over a wide frequency band. The inventor thus completed the present disclosure.

Specifically, the present disclosure aims to advantageously solve the problem set forth above and the disclosed electromagnetic wave absorbing sheet comprises: a sheet-shaped fibrous substrate; and carbon nanotubes positioned in a space inside in a thickness direction of the sheet-shaped fibrous substrate, wherein the fibrous substrate is composed of organic fibers, the carbon nanotubes comprise single-walled carbon nanotubes as a main component, and the electromagnetic wave absorbing sheet has an electrical conductivity of 0.7 S/cm or more and 20 S/cm or less. Such an electromagnetic wave absorbing sheet in which carbon nanotubes comprising single-walled carbon nanotubes as a main component are positioned in a space inside in a thickness direction of a sheet-shaped fibrous substrate made of organic fibers and whose electrical conductivity falls within a predetermined range can exert a good electromagnetic wave absorbing ability over a wide frequency band.

The phrase "carbon nanotubes comprise single-walled carbon nanotubes as a main component" and other grammatically equivalent phrases, as used herein, mean that the proportion of the mass of single-walled carbon nanotubes is more than 50% by mass based on the total mass (100% by mass) of carbon nanotubes included in the electromagnetic wave absorbing sheet.

It is preferred that at least one of main surfaces of the electromagnetic wave absorbing sheet has a surface roughness Sa of 10 μm or more. When the surface roughness Sa of at least one of main surfaces of the electromagnetic wave absorbing sheet is 10 μm or more, it is possible for the electromagnetic wave absorbing sheet to have a better electromagnetic wave absorbing ability over a wide frequency band.

"Surface roughness Sa" can be measured in accordance with ISO25178.

It is preferred that the electromagnetic wave absorbing sheet has a thickness of 150 μm or less and a transmission attenuation power ratio of 20 dB or more for at least one frequency from 1 GHz to 10 GHz. When the thickness is 150 μm or less and the transmission attenuation power ratio is 20 dB or more for at least one frequency from 1 GHz to 10 GHz, it is possible to reduce the thickness and weight of the electromagnetic wave absorbing sheet and to further increase the electromagnetic wave absorbing ability for at least one frequency from 1 GHz to 10 GHz.

The thickness and the transmission attenuation power ratio in the predetermined range of the electromagnetic wave absorbing sheet can be measured by the methods described in Examples herein.

The present disclosure aims to advantageously solve problem set forth above and the disclosed method of manufacturing an electromagnetic wave absorbing sheet is a method of manufacturing any of the electromagnetic wave absorbing sheets described above and comprises filtering a dispersion of the carbon nanotubes through the fibrous substrate. By filtering the dispersion of the carbon nanotubes through the fibrous substrate, it is possible to favorably manufacture any of the disclosed electromagnetic wave absorbing sheets described above.

The present disclosure aims to advantageously solve problem set forth above and the disclosed method of manufacturing an electromagnetic wave absorbing sheet is a method of manufacturing any of the electromagnetic wave absorbing sheets described above and comprises stirring a dispersion of the carbon nanotubes and the fibrous substrate under a reduced pressure condition. By stirring the dispersion of the carbon nanotubes and the fibrous substrate under a reduced pressure condition, it is possible to favorably manufacture any of the disclosed electromagnetic wave absorbing sheets described above.

It is preferred that the disclosed method of manufacturing an electromagnetic wave absorbing sheet comprises removing, from the fibrous substrate to which the dispersion of the carbon nanotubes has been attached by the stirring, a dispersion medium of the dispersion. By removing, from the fibrous substrate to which the dispersion of the carbon nanotubes has been attached by the stirring, a dispersion medium of the dispersion, it is possible to more favorably manufacture any of the disclosed electromagnetic wave absorbing sheets described above.

Advantageous Effect

According to the present disclosure, it is possible to provide an electromagnetic wave absorbing sheet which can exert a good electromagnetic wave absorbing ability over a wide frequency band.

According to the present disclosure, it is also possible to provide a method of manufacturing an electromagnetic wave absorbing sheet, which method can favorably manufacture an electromagnetic wave absorbing sheet which can exert a good electromagnetic wave absorbing ability over a wide frequency band.

DETAILED DESCRIPTION

The following provides a detailed description of an embodiment of the present disclosure.

(Electromagnetic Wave Absorbing Sheet)

The disclosed electromagnetic wave absorbing sheet comprises a sheet-shaped fibrous substrate and carbon nanotubes positioned in a space inside in a thickness direction of the sheet-shaped fibrous substrate, wherein the fibrous substrate is composed of organic fibers, the carbon nanotubes comprise single-walled carbon nanotubes as a main component, and the electromagnetic wave absorbing sheet has an electrical conductivity that falls within a predetermined range. The electromagnetic wave absorbing sheet may optionally comprise other components such as additives that have been used during manufacturing of the electromagnetic wave absorbing sheet. The electromagnetic wave absorbing sheet can exert a good electromagnetic wave absorbing ability over a wide frequency band.

The carbon nanotubes are usually attached to the organic fibers constituting the sheet-shaped fibrous substrate. The phrase "carbon nanotubes are attached to the organic fibers constituting the sheet-shaped fibrous substrate" and other grammatically equivalent phrases, as used herein, refer to a state in which the carbon nanotubes are attached to or entangled with the organic fibers, building blocks of the sheet-shaped fibrous substrate. In the disclosed electromagnetic wave absorbing sheet, the carbon nanotubes are usually attached not only to the organic fibers positioned on the surface of the sheet-shaped fibrous substrate, but also to the organic fibers positioned inside in the thickness direction of the sheet-shaped fibrous substrate.

<Sheet-Shaped Fibrous Substrate>

Sheet-shaped fibrous substrates which can be used for the electromagnetic wave absorbing sheet are not particularly limited as long as they are composed of organic fibers.

Organic fibers used to constitute the sheet-shaped fibrous substrate are not particularly limited and examples thereof include synthetic fibers made of polymers such as polyvinyl alcohol, vinylon, polyethylene vinyl alcohol, polyethylene glycol, polyvinylpyrrolidone, poly-ε-caprolactone, polyacrylonitrile, polylactic acid, polycarbonate, polyamide, polyimide, polyethylene, polypropylene, polyethylene terephthalate, and modified products thereof; natural fibers such as cotton, hemp, wool, and silk; and so forth. Polymers for synthetic fibers can be used either alone or in combination of two or more types. Preferred organic fibers are synthetic fibers, with vinylon, an acetalized polyvinyl alcohol, being more preferred. The sheet-shaped fibrous substrate can be a woven or nonwoven fabric which can be composed of these organic fibers. The sheet-shaped fibrous substrate is preferably a nonwoven fabric. The term "nonwoven fabric" as used herein refers to a fiber sheet web or batt of directionally or randomly orientated fibers, bonded by at least one of entanglement, cohesion and adhesion, as defined in JIS L 0222 (provided that paper and products which are woven, knitted, tufted, or felted by milling are excluded).

It is defined herein that carbon nanotubes are not encompassed by the organic fibers described above.

<Carbon Nanotubes>

Carbon nanotubes (CNTs) included in the disclosed electromagnetic wave absorbing sheet comprise single-walled carbon nanotubes (single-walled CNTs) as a main component. Examples of components of CNTs other than single-walled CNTs include multi-walled carbon nanotubes (multi-walled CNTs). The proportion of single-walled CNTs based on the entire mass of the CNTs needs to be more than 50% by mass, preferably 90% by mass or more, more preferably 95% by mass or more, and may be 100% by mass. When the CNTs include multi-walled CNTs, the wall number of multi-walled CNTs is preferably 5 or less.

It is not clear why the disclosed electromagnetic wave absorbing sheet in which carbon nanotubes comprising single-walled carbon nanotubes as a main component are positioned in a space inside in the thickness direction of a sheet-shaped fibrous substrate and whose electrical conductivity falls within a predetermined range can exert a good electromagnetic wave absorbing ability over a wide frequency band. However, a possible mechanism is as follows: First, single-walled CNTs have higher electrical conductivity than multi-walled CNTs. Thus, positioning single-walled CNTs in a space inside in the thickness direction of the sheet-shaped fibrous substrate can provide the surface of the resulting electromagnetic wave absorbing sheet with moderately high electrical conductivity derived from the single-walled CNTs while allowing the surface to be kept rich in irregularities derived from the sheet-shaped fibrous substrate. Such a surface which is rich in irregularities and given moderately high electrical conductivity is considered to contribute to a good electromagnetic wave absorbing ability of the electromagnetic wave absorbing sheet over a wide frequency band.

Preferred attributes of CNTs used herein will be described below. Such attributes preferably apply both to CNTs as a raw material of the disclosed electromagnetic wave absorbing sheet and CNTs included in the disclosed electromagnetic wave absorbing sheet. More specifically, in principle, values of at least BET specific surface area, average diameter, etc. do not fall below the values of BET specific surface area, average diameter, etc. of the CNTs as a raw material even after various treatments included in the method of manufacturing an electromagnetic wave absorbing sheet (later described) have been performed.

CNTs can be produced by any CNT synthesis methods known in the art such as, for example, arc discharging, laser ablation, or chemical vapor deposition (CVD). Specifically, CNTs can be efficiently produced by the super growth method (see WO2006/011655) wherein during synthesis of CNTs through chemical vapor deposition (CVD) by supplying a feedstock compound and a carrier gas onto a substrate having thereon a catalyst layer for carbon nanotube production, the catalytic activity of the catalyst layer is dramatically improved by providing a trace amount of an oxidizing agent (catalyst activating material) in the system. Hereinafter, carbon nanotubes obtained by the super growth method may also be referred to as "SGCNTs."

Preferably, CNTs used herein exhibit an upwardly convex shape in a t-plot obtained from the adsorption isotherm.

The growth of an adsorbed layer of nitrogen gas for a material having pores at the surface is divided into the following processes (1) to (3). The gradient of the t-plot changes according to following processes (1) to (3):

(1) a process in which a single molecular adsorption layer is formed over the entire surface by nitrogen molecules;

(2) a process in which a multi-molecular adsorption layer is formed in accompaniment to capillary condensation filling of pores; and (3) a process in which a multi-molecular adsorption layer is formed on a surface that appears to be non-porous due to the pores being filled by nitrogen.

A t-plot exhibiting a convex upward shape shows a straight line crossing the origin in a region in which the average adsorbed nitrogen gas layer thickness t is small, but the plot deviates downward from the straight line as t increases. CNTs whose t-plot shows such a shape indicate that the ratio of internal specific surface area to total specific surface area of the CNTs is large, which indicate the presence of a large number of openings formed in the CNTs. As a result, when a dispersion is prepared using such CNTs, the CNTs are less likely to aggregate in the dispersion, making it possible to obtain an electromagnetic wave absorbing sheet which is homogeneous and has a better electromagnetic wave absorbing ability over a wide frequency band.

It is preferred that the t-plot for CNTs has a bending point in a range of $0.2 \le t$ (nm) $\le 1.5$, more preferably in a range of $0.45 \le t$ (nm) $\le 1.5$, and even more preferably in a range of $0.55 \le t$ (nm) $\le 1.0$. When CNTs whose t-plot has a bending point falling within the above range is used to prepare a dispersion, the CNTs are much less likely to aggregate in the dispersion, making it possible to obtain an electromagnetic wave absorbing sheet which is more homogeneous and has a better electromagnetic wave absorbing ability over a wide frequency band.

The "position of the bending point" is an intersection point of an approximate straight line A for process (1) and an approximate straight line B for process (3).

It is further preferred that CNTs used herein have a ratio of internal specific surface area S2 to total specific surface area S1 (S2/S1), obtained from a t-plot, of 0.05 or more and 0.30 or less. CNTs whose S2/S1 falls within the range described above are much less likely to aggregate in a dispersion of the CNTs. As a result, it is possible to obtain an electromagnetic wave absorbing sheet which is more homogeneous and has a better electromagnetic wave absorbing ability over a wide frequency band.

Total specific surface area S1 and internal specific surface area S2 of CNTs can be found from the t-plot. Specifically, first, total specific surface area S1 can be found from the gradient of an approximate straight line corresponding to process (1) and external specific surface area S3 can be found from the gradient of an approximate straight line corresponding to process (3). Internal specific surface area S2 can then be calculated by subtracting external specific surface area S3 from total specific surface area S1.

Measurement of an adsorption isotherm of CNTs, creation of a t-plot, and calculations of total specific surface area S1 and inner specific surface area S2 based on the t-plot analysis can be performed for example using BELSORP®-mini ("BELSORP" is a registered trademark in Japan, other countries, or both), a commercially available measurement instrument available from Bel Japan Inc.

CNTs used herein also preferably have a BET specific surface area of 600 $m^2/g$ or more, and more preferably 800 $m^2/g$ or more, but preferably 2,000 $m^2/g$ or less, more preferably 1,800 $m^2/g$ or less, and even more preferably 1,600 $m^2/g$ or less. When the BET specific surface area falls within the above range, the electromagnetic wave absorbing sheet can exert a better electromagnetic wave absorbing ability over a wide frequency band. The term "BET specific surface area" as used herein refers to a nitrogen adsorption specific surface area measured by the BET (Brunauer-Emmett-Teller) method.

The average diameter of the CNTs is preferably 1 nm or more, but preferably 60 nm or less, more preferably 30 nm or less, and even more preferably 10 nm or less.

The average length of the CNTs is preferably 10 μm or more, more preferably 50 μm or more, and even more preferably 80 μm or more, but preferably 600 μm or less, more preferably 500 μm or less, and even more preferably 400 μm or less.

When CNTs having an average diameter and/or an average length that fall the ranges described above are used to prepare a dispersion, the CNTs are less likely to aggregate in the dispersion, making it possible to obtain an electromagnetic wave absorbing sheet which is homogeneous and has a better electromagnetic wave absorbing ability over a wide frequency band.

Further, CNTs used herein usually have an aspect ratio (length/diameter) of greater than 10.

The average diameter, average length, and aspect ratio of CNTs can be determined by measuring the diameters and lengths of 100 randomly-selected CNTs by scanning electron microscopy or transmission electron microscopy.

The amount per unit area of CNTs in the disclosed electromagnetic wave absorbing sheet is preferably 0.05 $mg/cm^2$ or more, and more preferably 0.10 $mg/cm^2$ or more, but preferably 0.60 $mg/cm^2$ or less, and more preferably 0.55 $mg/cm^2$ or less. When the amount per unit area of CNTs in the electromagnetic wave absorbing sheet is equal to or greater than the above-mentioned lower limit value, the electromagnetic wave absorbing sheet can exert a moderately high electrical conductivity, allowing the sheet to exert a better electromagnetic wave absorbing ability over a wide frequency band. On the other hand, when the amount per unit of CNTs in the electromagnetic wave absorbing sheet is equal to or less than the above upper limit value, it is possible to prevent excessively high amounts of CNTs from entering a space inside in the thickness direction of the sheet-shaped fibrous substrate thus preventing the irregularities present on the surface of the electromagnetic wave absorbing sheet from being impaired. As such, the electromagnetic wave absorbing sheet can exert a better electromagnetic wave absorbing ability over a wide frequency band.

The amount per unit area of CNTs in the electromagnetic wave absorbing sheet can be calculated as follows: The mass $W^s$ (mg) of a test piece obtained by cutting the electromagnetic wave absorbing sheet into a piece with dimensions of 5 cm×5 cm (area: 25 cm$^2$) is first measured. The mass $W^f$ (mg) of the fibrous substrate used to manufacture the electromagnetic wave absorbing sheet is subtracted from $W^s$ (mg) to find the total deposited amount of CNTs, $W^{CNT}$ (mg). Finally, $W^{CNT}$ (mg) is divided by the area of the test piece to find the deposited amount (mg) of CNTs per area (cm$^2$) of the test piece as the amount per area of CNTs in units of mg/cm$^2$.

The amount per unit area of CNTs in the electromagnetic wave absorbing sheet can be adjusted by changing various conditions under which the electromagnetic wave absorbing sheet is manufactured.

<Electrical Conductivity>

The electrical conductivity of the disclosed electromagnetic wave absorbing sheet is 0.7 S/cm or more and 20 S/cm or less. The electrical conductivity of the electromagnetic wave absorbing sheet is preferably 1 S/cm or more, and more preferably 1.5 S/cm or more. The electrical conductivity of the electromagnetic wave absorbing sheet is preferably 17 S/cm or less, and more preferably 15 S/cm or less. When the electrical conductivity of the electromagnetic wave absorbing sheet falls within the predetermined range described above, the electromagnetic wave absorbing sheet can exert a good electromagnetic wave absorbing ability over a wide frequency band.

Electrical conductivity is the reciprocal of electrical resistivity. The electrical conductivity of the electromagnetic wave absorbing sheet can be controlled for example by changing the amount per unit area of CNTs in the electromagnetic wave absorbing sheet. For example, increasing the amount per unit area of CNTs increases the electrical conductivity of the electromagnetic wave absorbing sheet, whereas decreasing the amount per unit area of CNTs lowers the electrical conductivity of the electromagnetic wave absorbing sheet.

<Electromagnetic Wave Absorbing Ability>

The disclosed electromagnetic wave absorbing sheet preferably has a transmission attenuation power ratio of 20 dB or more for at least one frequency from 1 GHz to 10 GHz, and more preferably has a transmission attenuation power ratio of 20 dB or more over the entire frequency band from 1 GHz to 10 GHz. An electromagnetic wave absorbing sheet having a transmission attenuation power ratio of 20 dB or more for at least one frequency from 1 GHz to 10 GHz can exert a better electromagnetic wave absorbing ability for the at least one frequency from 1 GHz to 10 GHz.

<Thickness>

The thickness of the disclosed electromagnetic wave absorbing sheet is preferably 5 μm or more, but preferably 150 μm or less, and more preferably 75 μm or less. When the thickness of the electromagnetic wave absorbing sheet is equal to or greater than the above-mentioned lower limit, the electromagnetic wave absorbing sheet can have sufficient mechanical strength and also can exert a better electromagnetic wave absorbing ability over a wide frequency band. On the other hand, when the thickness of the electromagnetic wave absorbing sheet is equal to or less than the above upper limit, it is possible to reduce the thickness and weight of the electromagnetic wave absorbing sheet.

<Surface Roughness>

At least one of the main surfaces of the disclosed electromagnetic wave absorbing sheet preferably has a surface roughness Sa of 10 μm or more, more preferably 15 μm or more, but preferably 50 μm or less. When the roughness Sa of at least one of the main surfaces of the electromagnetic wave absorbing sheet is equal to or greater than the above-mentioned lower limit, the electromagnetic wave absorbing sheet can exert a better electromagnetic wave absorbing ability over a wide frequency band.

The surface roughness Sa of the main surface of the electromagnetic wave absorbing sheet can be adjusted by changing the sheet-shaped fibrous substrate to be used and the conditions in the steps of manufacturing the electromagnetic wave absorbing sheet.

(Method of Manufacturing Electromagnetic Wave Absorbing Sheet)

The disclosed method of manufacturing an electromagnetic wave absorbing sheet is a method of manufacturing the electromagnetic wave absorbing sheet described above and comprises at least one of: filtering a dispersion of the carbon nanotubes through a fibrous substrate; and stirring a dispersion of the carbon nanotubes and a fibrous substrate under a reduced pressure condition (stirring under reduced pressure). With the disclosed manufacturing method, it is possible to favorably manufacture the electromagnetic wave absorbing sheet described above.

<Manufacturing Method with Filtering Step>

The disclosed manufacturing method with a filtering step comprises filtering a dispersion of the carbon nanotubes through a fibrous substrate.

The disclosed manufacturing method may comprise step(s) than the filtering step.

<<Filtering Step>>

In the filtering step, a dispersion of the carbon nanotubes described above is filtered through a fibrous substrate. This yields a primary sheet in which the carbon nanotubes are positioned in a space inside in the thickness direction of the fibrous substrate. The primary sheet thus obtained can be directly used as the disclosed electromagnetic wave absorbing sheet.

The dispersion of carbon nanotubes (CNT dispersion) can be prepared by dispersing in a dispersion medium CNTs which comprise single-walled CNTs as a main component. Single-walled CNTs and other CNTs that can be used to prepare the dispersion can be single-walled CNTs and multi-walled CNTs such as those described above. The dispersion medium is not particularly limited and examples of dispersion media usable herein include water, isopropanol, 1-methyl-2pyrrolidone, dimethylformamide, dimethyl sulfoxide, dimethylacetamide, toluene, tetrahydrofuran, ethyl acetate, acetonitrile, ethylene glycol, methyl isobutyl ketone, and butyl alcohol, with water being preferred.

When preparing a CNT dispersion, dispersants may be blended as additives in order to improve the dispersibility of CNTs in the CNT dispersion. The dispersants are not particularly limited. Dispersants that can be used herein include surfactants known in the art, such as sodium dodecylsulfonate, sodium deoxycholate, sodium cholate, and sodium dodecylbenzenesulfonate, and synthetic or natural polymers which can function as a dispersant. Dispersants can be added in amounts which are common in the art.

When preparing a CNT dispersion, CNTs are added to a dispersion medium blended with a surfactant such as that described above to afford a crude dispersion. The CNTs in the crude dispersion are then dispersed by the dispersing method in which a cavitation effect is obtainable and/or by the dispersing method in which a crushing effect is obtainable, e.g., dispersing methods disclosed in WO2014/115560, to afford a CNT dispersion with well-dispersed CNTs. Dispersing methods contemplated herein are not limited to the two methods; dispersing methods that use a stirring bar for direct stirring can also be used.

When preparing a CNT dispersion, other components (e.g., carbon materials other than carbon nanotubes, and additives) may be optionally blended into the CNT dispersion. When other components are added, they can be added for example to a crude dispersion of CNTs.

The dispersing time when preparing a CNT dispersion can be, for example, 1 minute to 120 minutes.

The CNT concentration in the CNT dispersion is preferably 0.01% by mass or more, more preferably 0.02% by mass or more, and even more preferably 0.05% by mass or more, but preferably 0.3% by mass or less, more preferably 0.2% by mass or less, and even more preferably 0.1% by mass or less. When the CNT concentration in the CNT dispersion is equal to or greater than the above lower limit, it is possible to allow CNTs to efficiently enter a space inside in the thickness direction of the fibrous substrate in the filtering step described later. On the other hand, when the CNT concentration in the CNT dispersion is equal to or less than the above upper limit, CNTs are less likely to aggregate in the dispersion, making it possible to obtain an electromagnetic wave absorbing sheet which is homogeneous and has a better electromagnetic wave absorbing ability over a wide frequency band.

It is preferred that the obtained CNT dispersion is degassed before filtered through a fibrous substrate. When the degassed CNT dispersion is filtered by a fibrous substrate, it is possible to easily allow CNTs to enter a space inside in the thickness direction of the fibrous substrate.

Methods of degassing the CNT dispersion are not particularly limited and degassing can be accomplished by using a degassing device known in the art. Degassing methods that use a reduced-pressure stirring device (vacuum stirring device) are preferred from the viewpoint of achieving favorable degassing while preventing aggregation of CNTs in the CNT dispersion.

Methods of filtering the carbon nanotube dispersion through the fibrous substrate are not particularly limited and filtering methods known in the art can be used, e.g., natural filtering, vacuum filtering (suction filtering), pressurized filtering, and centrifugal filtering. From the viewpoint of allowing CNTs to enter a space inside in the thickness direction of the fibrous substrate simply and favorably, vacuum filtering (suction filtering) or pressurized filtering is preferred, with vacuum filtering (suction filtering) being more preferred.

The conditions (e.g., pressure) during vacuum filtering (suction filtering) or pressurized filtering can be freely determined depending for example on the desired surface roughness of the main surface of the resulting electromagnetic wave absorbing sheet.

The fibrous substrate used in the filtering step can be, for example, the sheet-shaped fibrous substrate composed of organic fibers, described above in the section "Electromagnetic wave absorbing sheet."

The basis weight of the fibrous substrate is preferably 4 $g/m^2$ or more, and more preferably 8 $g/m^2$ or more, but preferably 150 $g/m^2$ or less, and more preferably 120 $g/m^2$ or less. When the basis weight of the fibrous substrate is equal to or greater than the above-mentioned lower limit, it is possible to further increase the electromagnetic wave absorbing ability of the electromagnetic wave absorbing sheet over a wide frequency band and also to sufficiently increase the mechanical strength of the electromagnetic wave absorbing sheet. On the other hand, when the basis weight of the fibrous substrate is equal to or less than the above upper limit, the weight of the electromagnetic wave absorbing sheet can be reduced.

The thickness of the fibrous substrate is preferably 5 µm or more, but preferably 500 µm or less, and more preferably 400 µm or less. When the thickness of the fibrous substrate is equal to or greater than the above lower limit, it is possible to enhance the electromagnetic wave absorbing ability of the electromagnetic wave absorbing sheet over a wide frequency band and also to sufficiently increase the mechanical strength of the electromagnetic wave absorbing sheet. On the other hand, when the thickness of the fibrous substrate is equal to or less than the above upper limit, it is possible to reduce the thickness and weight of the electromagnetic wave absorbing sheet.

<<Other Steps>>

The disclosed method of manufacturing an electromagnetic wave absorbing sheet may comprise step(s) other than the filtering step described above. Other steps are not particularly limited and examples include a drying step.

[Drying Step]

In the drying step, the primary sheet can be dried to form an electromagnetic wave absorbing sheet. Although the dispersion medium and solvent used in the above-described steps may remain in the primary sheet, the amount of the remaining solvent in the obtained electromagnetic wave absorbing sheet can be reduced by drying the primary sheet.

Drying methods used in the drying step are not particularly limited and examples of drying methods include hot air drying, vacuum drying, hot roll drying, and infrared irradiation. The drying temperature is not particularly limited but is usually from room temperature to 200° C. The drying time is not particularly limited but is usually 1 hour to 48 hours.

In the disclosed manufacturing method, the fibrous substrate may shrink by heat etc. in the drying step. As such, the fibrous substrate before used in the manufacturing method and the fibrous substrate provided in the electromagnetic wave absorbing sheet obtained by the manufacturing method may differ in basis weight, thickness, fineness of organic fibers, etc.

<Manufacturing Method with Reduced-Pressure Stirring Step>

The disclosed manufacturing method with a reduced-pressure stirring step comprises stirring a dispersion of the carbon nanotubes and a fibrous substrate under a reduced-pressure condition.

The manufacturing method may comprise step(s) other than the reduced-pressure stirring step.

<<Reduced-Pressure Stirring Step>>

In the reduced-pressure stirring step, a dispersion of the carbon nanotubes and a fibrous substrate are stirred under a reduced-pressure condition. This yields a fibrous substrate to which the dispersion of the carbon nanotubes is attached.

In the reduced-pressure stirring step, for example, a dispersion of the carbon nanotubes and a fibrous substrate can be put in the same container and stirred under a reduced-pressure condition using a reduced-pressure stirring device (vacuum stirring device) known in the art.

The dispersion of the carbon nanotubes can be, for example, the CNT dispersion described above in the section "Filtering step."

The fibrous substrate can be, for example, the sheet-shaped fibrous substrate composed of organic fibers described above in the section "Electromagnetic wave absorbing sheet."

The vacuuming conditions etc. during stirring can be determined as appropriate such that a desired effect of the present disclosure can be attained.

<<Other Steps>>

The disclosed method of manufacturing an electromagnetic wave absorbing sheet may comprise step(s) other than the reduced-pressure stirring step described above. Other steps are not particularly limited and examples include a dispersion medium removing step.

[Dispersion Medium Removing Step]

In the dispersion medium removing step, the dispersion medium contained in the carbon nanotube dispersion is removed from the fibrous substrate to which the carbon nanotube dispersion has been attached by the reduced pressure stirring step. When the dispersion medium removing step is performed, the electromagnetic wave absorbing sheet can be manufactured more favorably.

Methods of removing the dispersion medium contained in the carbon nanotube dispersion from the fibrous substrate to which the carbon nanotube dispersion has been attached are not particularly limited. The filtering methods such as suction filtering described above in the section "Filtering step" and the drying methods described above in the section "Drying step" can be used. These filtering methods and drying methods may be used in combination.

EXAMPLES

The following will provide a more specific description of the present disclosure based on Examples, which however shall not be construed as limiting the scope of the present disclosure.

In Examples and Comparative Examples, thickness, three-dimensional surface profile, surface roughness, electrical conductivity, and electromagnetic wave absorbing ability of electromagnetic wave absorbing sheets were measured or calculated by the methods described below.

<Thickness>

The thickness of the electromagnetic wave absorbing sheets manufactured in Examples and Comparative Examples was measured using Digimatic Standard Outside Micrometer (manufactured by Mitutoyo Corporation).

<Three-Dimensional Surface Profile and Surface Roughness Sa>

For both sides of the electromagnetic wave absorbing sheets manufactured in Examples and Comparative Examples, a three-dimensional surface profile and a surface roughness Sa in a 45 mm×45 mm area were measured in accordance with ISO25178 using One-shot 3D Measuring Macroscope (manufactured by KEYENCE Corporation).

<Electrical Conductivity>

For the electromagnetic wave absorbing sheets manufactured in Examples and Comparative Examples, electrical conductivity was calculated by the four-probe method in which probes are placed on one side of the sheet, in accordance with JIS K 7194 using a resistivity meter for low resistivity (Loresta® GX (Loresta is a registered trademark in Japan, other countries, or both), manufactured by Mitsubishi Chemical Analytech Co., Ltd.).

<Electromagnetic Wave Absorbing Ability>

For the electromagnetic wave absorbing sheets manufactured in Examples and Comparative Examples, the reflection coefficient S11 and the transmission coefficient S21 were measured by the microstrip line method in accordance with IEC-62333-2, and the transmission attenuation power ratio Rtp was calculated. Measuring instruments and frequencies used are as follows:

Network analyzer: Vector Network Analyzer 37 169A manufactured by ANRITSU CORPORATION Measuring instruments: TF-3B (0.1 GHz to 3 GHz) manufactured by KEYCOM Corporation, TF-18C (3 GHz to 18 GHz) manufactured by KEYCOM Corporation The transmission attenuation power ratio Rtp was evaluated based on the criteria given below. The higher the transmission attenuation power ratio for a given frequency, the better the electromagnetic wave absorbing ability of the electromagnetic wave absorbing sheet at that frequency.

A: Transmission attenuation power ratio for a given frequency is 20 dB or more

B: Transmission attenuation power ratio for a given frequency is less than 20 dB Example 1-1

<Preparation of Carbon Nanotube Dispersion>

Using sodium dodecylbenzenesulfonate (SDBS) as a dispersant and water as a dispersion medium, 500 mL of a 1 mass % aqueous SDBS solution was prepared. To the aqueous SDBS solution was added 0.5 g of SGCNTs (ZEONANO® SG101 (ZEONANO is a registered trademark in Japan, other countries, or both), BET specific surface area: 1,050 $m^2/g$, average diameter: 3.3 nm, average length: 400 t-plot: upwardly convexed (position of bending point: 0.6 nm), internal specific surface area S2/total specific surface area S1: 0.24) as single-walled CNTs to prepare a crude dispersion containing SDBS. The crude dispersion was loaded into a high-pressure homogenizer (BERYU SYSTEM PRO, manufactured by Beryu Corporation) equipped with a multi-step pressure controller (multi-step pressure reducer) configured to apply a back pressure during dispersing for dispersing treatment at a pressure of 100 MPa. More specifically, while applying a back pressure, a shearing force was applied to the crude dispersion to disperse CNTs. In this way, a SGCNT dispersion with a concentration of 0.1% by mass was prepared. The dispersing treatment was performed for 10 minutes with the dispersion flowed out from the high-pressure homogenizer being repeatedly transferred back to the high-pressure homogenizer.

<Reduced-Pressure Stirring Step to Filtering Step>

150 mL of the 0.1 mass % SGCNT dispersion obtained as described above and vinylon nonwoven fabric (manufactured by KURARAY CO. LTD., product code: BFN No. 3, basis weight: 36 $g/m^2$, thickness: 123 μm) with dimensions of 5 cm×10 cm as a sheet-shaped fibrous substrate were placed in a 250 mL container and stirred under vacuum at a rotational speed of 2,000 rpm at a pressure of 0.5 kPa for 5 minutes using ARV-310 manufactured by THINKY CORPORATION. The vinylon nonwoven fabric was taken out from the container and filtered by suction to afford a primary sheet in which the SGCNTs are positioned in a space inside in the thickness direction of the vinylon nonwoven fabric.
<Drying Step>

The primary sheet after the filtering step was dried under vacuum at 80° C. for 24 hours to afford an electromagnetic wave absorbing sheet. The obtained electromagnetic wave absorbing sheet was subjected to various measurements and calculations in accordance with the methods described above. The results are shown in Table 1 and FIGS. 1 and 2. When a cross-section of the electromagnetic wave absorbing sheet was observed by scanning electron microscopy (SEM; JSM-7800F Prime, manufactured by JEOL Ltd.), the carbon nanotubes were positioned in a space inside in the thickness direction of the sheet-shaped fibrous substrate.

Example 1-2

An electromagnetic wave absorbing sheet was obtained as in Example 1-1 except that the basis weight of the vinylon nonwoven fabric as the sheet-shaped fibrous substrate was changed to 12 g/m² and the thickness of the vinylon nonwoven fabric to 58 μm. The obtained electromagnetic wave absorbing sheet was subjected to various measurements and calculations in accordance with the methods described above. The results are shown in Table 1 and FIGS. 1 and 2. When a cross-section of the electromagnetic wave absorbing sheet was observed by SEM, the carbon nanotubes were positioned in a space inside in the thickness direction of the sheet-shaped fibrous substrate.

Comparative Example 1-1

An electromagnetic wave absorbing sheet was obtained as in Example 1-1 except that the following impregnating step was carried out instead of the filtering step. The obtained electromagnetic wave absorbing sheet was subjected to various measurements and calculations in accordance with the methods described above. The results are shown in Table 1 and FIGS. 1 and 2. When a cross-section of the electromagnetic wave absorbing sheet was observed by SEM, a layer of carbon nanotubes was attached to the surface of the sheet, but carbon nanotubes were not positioned in a space inside in the thickness direction of the sheet-shaped fibrous substrate.
<Impregnating Step>

150 mL of the 0.1% by mass SGCNT dispersion obtained as described above was placed in a 500 mL beaker, and vinylon nonwoven fabric (manufactured by KURARAY CO. LTD., product code: BFN No. 3, basis weight: 36 g/m², thickness: 123 μm) with dimensions of 5 cm×10 cm as a sheet-shaped fibrous substrate was impregnated with the dispersion and dried at normal temperature for 3 hours.

Comparative Example 1-2

An electromagnetic wave absorbing sheet was obtained as in Comparative Example 1-1 except that the basis weight of the vinylon nonwoven fabric as the sheet-shaped fibrous substrate was changed to 12 g/m² and the thickness of vinylon nonwoven fabric to 58 μm. The obtained electromagnetic wave absorbing sheet was subjected to various measurements and calculations in accordance with the methods described above. The results are shown in Table 1 and FIGS. 1 and 2. When a cross-section of the electromagnetic wave absorbing sheet was observed by SEM, a layer of carbon nanotubes was attached to the surface of the sheet, but carbon nanotubes were not positioned in a space inside in the thickness direction of the sheet-shaped fibrous substrate.

TABLE 1

| | Electromagnetic wave absorbing sheet | | | | | | | | | |
|---|---|---|---|---|---|---|---|---|---|---|
| | Fibrous substrate | | | | Surface | Surface | Amount per | Electromagnetic wave absorbing ability | | |
| | Basis | | | Electrical | roughness | roughness | unit area | | | |
| | weight [g/m²] | Thickness [μm] | Thickness [μm] | conductivity [S/cm] | (front) Sa [μm] | (back) Sa [μm] | of CNTs [mg/cm²] | 2.5 GHz | 5 GHz | 7.5 GHz |
| Ex. 1-1 | 36 | 123 | 94 | 7 | 23 | 24 | 0.16 | A | A | A |
| Ex. 1-2 | 12 | 58 | 43 | 6 | 30 | 31 | 0.48 | A | A | A |
| Comp. Ex. 1-1 | 36 | 123 | 95 | 0.1 | 5 | 7 | | B | B | B |
| Comp. Ex. 1-2 | 12 | 58 | 48 | 0.6 | 7 | 8 | | B | B | B |

Figure 1:
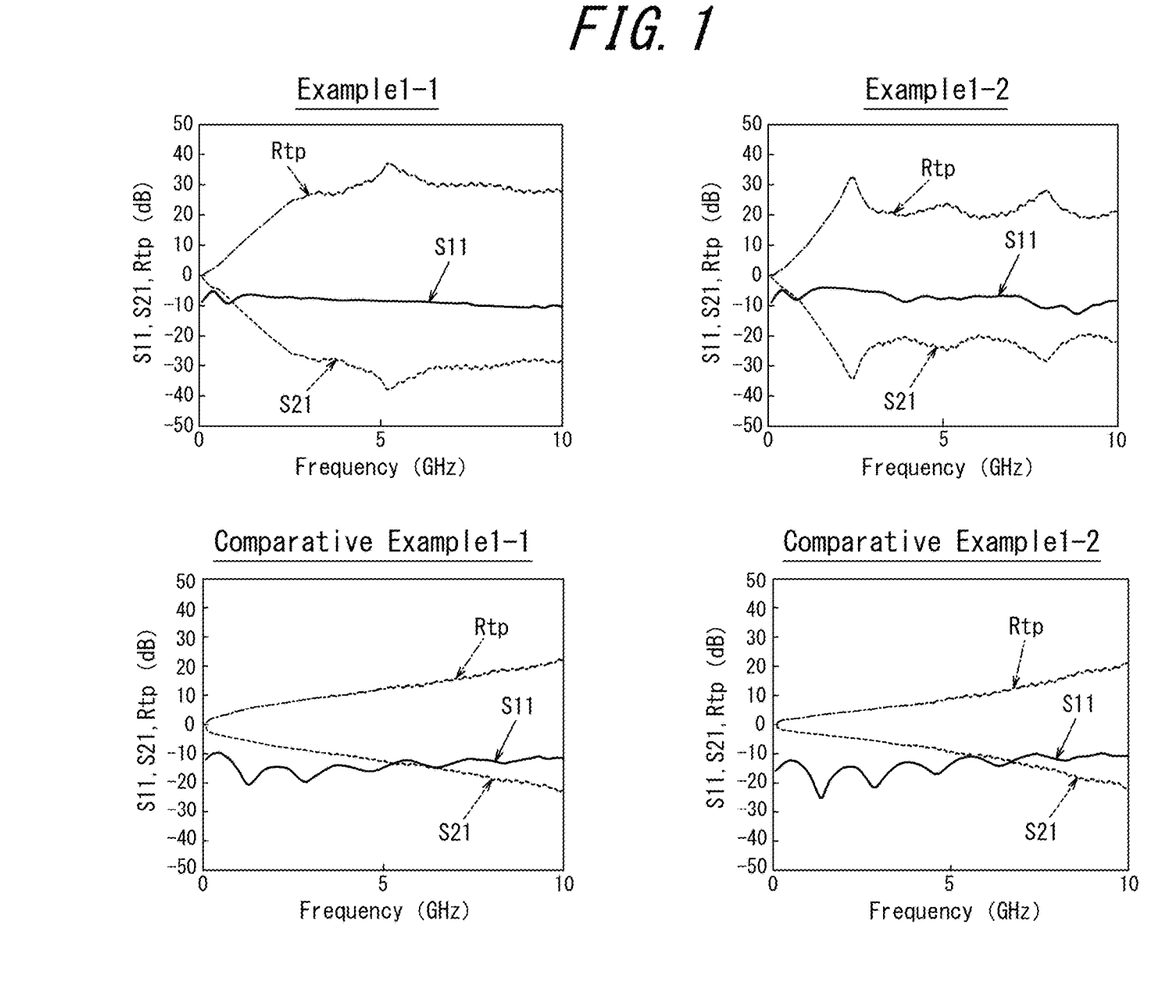
FIG. 1 depicts graphs showing plots of reflection coefficient S11, transmission coefficient S1 and transmission attenuation power ratio (Rtp) vs. electromagnetic wave frequency for the electromagnetic wave absorbing sheets prepared in Examples 1-1 and 1-2 and Comparative Examples 1-1 and 1-2.
Figure 2:
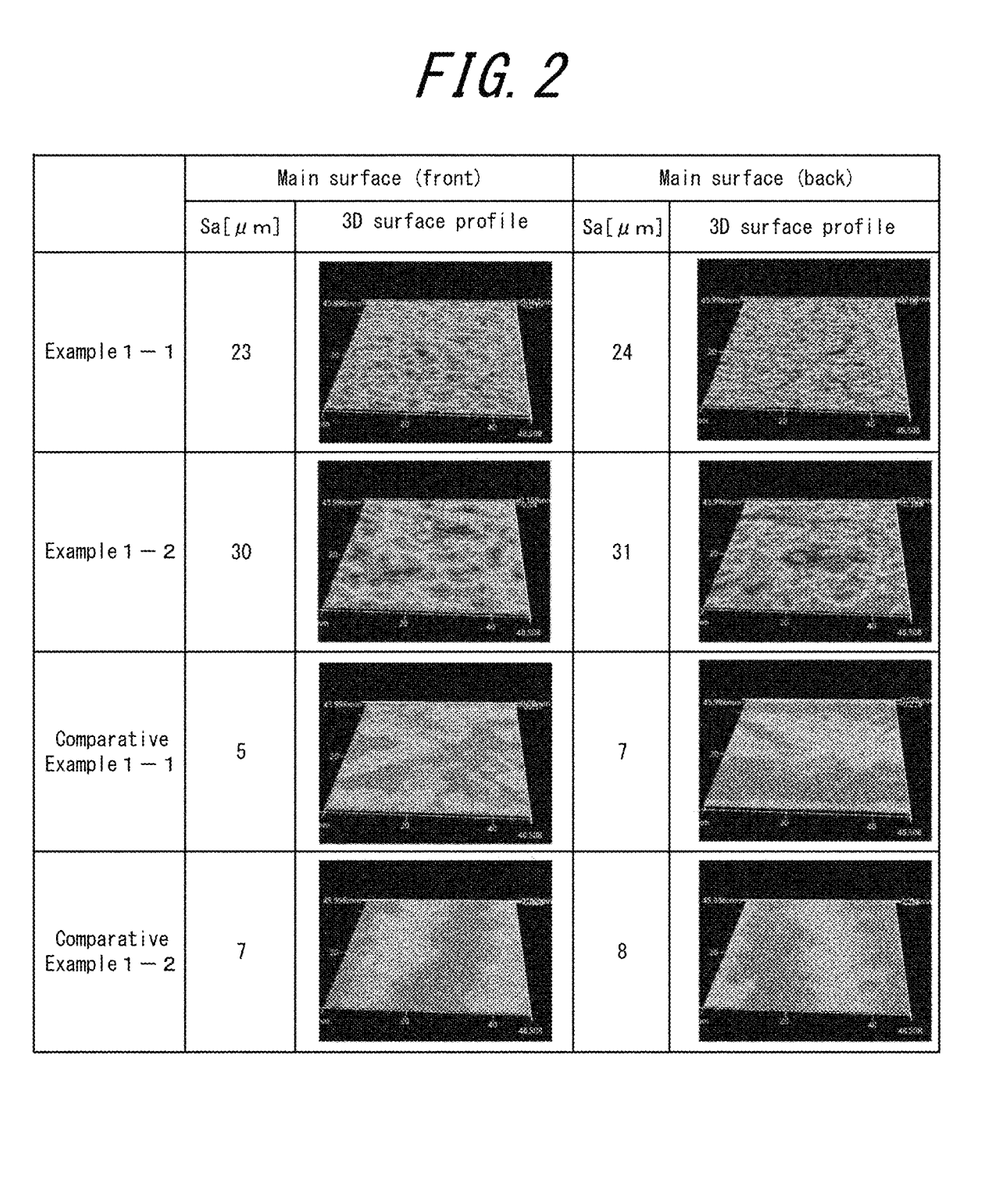
FIG. 2 depicts images showing surface roughness Sa values and three-dimensional surface profiles of the main surfaces of the electromagnetic wave absorbing sheets prepared in Examples 1-1 and 1-2 and Comparative Examples 1-1 and 1-2.

It is evident from Table 1 and FIG. 1 that the electromagnetic wave absorbing sheets of Examples 1-1 and 1-2, wherein carbon nanotubes comprising single-walled carbon nanotubes as a main component are positioned in a space inside in the thickness direction of a sheet-shaped fibrous substrate composed of organic fibers and electrical conductivity falls within a predetermined range, can exert a good electromagnetic wave absorbing ability over a wide frequency band.

On the other hand, it is evident from Table 1 and FIG. 1 that the electromagnetic wave absorbing sheets of Comparative Examples 1-1 and 1-2, wherein carbon nanotubes comprising single-walled carbon nanotubes as a main component are attached to the surface of a sheet-shaped fibrous substrate composed of organic fibers, but are not positioned in a space inside in the thickness direction of the sheet-shaped fibrous substrate and electrical conductivity falls outside a predetermined range, are inferior in the electromagnetic wave absorbing ability over a wide frequency band.

INDUSTRIAL APPLICABILITY

According to the present disclosure, it is possible to provide an electromagnetic wave absorbing sheet which can exert a good electromagnetic wave absorbing ability over a wide frequency band.

According to the present disclosure, it is also possible to provide a method of manufacturing an electromagnetic wave absorbing sheet, which method can favorably manufacture an electromagnetic wave absorbing sheet which can exert a good electromagnetic wave absorbing ability over a wide frequency band.

The invention claimed is:

1. An electromagnetic wave absorbing sheet comprising:
a sheet-shaped fibrous substrate; and
carbon nanotubes positioned in a space inside in a thickness direction of the sheet-shaped fibrous substrate, wherein
the fibrous substrate is composed of organic fibers,
the carbon nanotubes comprise single-walled carbon nanotubes as a main component, and
the electromagnetic wave absorbing sheet has an electrical conductivity of 0.7 S/cm or more and 20 S/cm or less.

2. The electromagnetic wave absorbing sheet according to claim 1, wherein at least one of main surfaces of the electromagnetic wave absorbing sheet has a surface roughness Sa of 10 μm or more.

3. The electromagnetic wave absorbing sheet according to claim 1, wherein the electromagnetic wave absorbing sheet has a thickness of 150 μm or less and a transmission attenuation power ratio of 20 dB or more for at least one frequency from 1 GHz to 10 GHz.

4. A method of manufacturing the electromagnetic wave absorbing sheet according to claim 1, comprising:
filtering a dispersion of the carbon nanotubes through the fibrous substrate.

5. A method of manufacturing the electromagnetic wave absorbing sheet according to claim 1, comprising:
stirring a dispersion of the carbon nanotubes and the fibrous substrate under a reduced pressure condition.

6. The method according to claim 5, further comprising removing, from the fibrous substrate to which the dispersion of the carbon nanotubes has been attached by the stirring, a dispersion medium of the dispersion.

* * * * *